United States Patent [19]
Tu et al.

[11] Patent Number: 5,989,971
[45] Date of Patent: Nov. 23, 1999

[54] METHOD FOR FORMING TRENCHED POLYSILICON STRUCTURE

[75] Inventors: Tuby Tu; Kuang-Chao Chen, both of Hsinchu, Taiwan

[73] Assignee: Mosel Vitelic Inc., Taiwan

[21] Appl. No.: 08/926,036

[22] Filed: Sep. 9, 1997

[30] Foreign Application Priority Data

Apr. 29, 1997 [TW] Taiwan ................................. 86105676

[51] Int. Cl.⁶ ............................................... H01L 21/8242
[52] U.S. Cl. ....................... 438/396; 438/253; 438/255; 438/398; 438/947; 438/964
[58] Field of Search .................... 438/253, 255, 438/396, 398, 665, 947, 964

[56] References Cited

U.S. PATENT DOCUMENTS

| | | | |
|---|---|---|---|
| 5,302,540 | 4/1994 | Ko et al. ................................. | 438/255 |
| 5,350,707 | 9/1994 | Ko et al. ................................. | 438/396 |
| 5,466,627 | 11/1995 | Lur et al. ................................ | 438/396 |
| 5,488,008 | 1/1996 | Kawamura .............................. | 438/398 |
| 5,538,592 | 7/1996 | Chen et al. ............................. | 438/396 |
| 5,670,406 | 9/1997 | Tseng ..................................... | 438/396 |
| 5,681,774 | 10/1997 | Tseng ..................................... | 438/396 |
| 5,804,480 | 9/1998 | Lu et al. ................................. | 438/253 |

*Primary Examiner*—Carl Whitehead, Jr.
*Assistant Examiner*—Toniae M. Thomas
*Attorney, Agent, or Firm*—Chapman and Cutler

[57] ABSTRACT

A method for forming a trenched polysilicon structure can be applied to a semiconductor device. The method includes steps of: a) providing a polysilicon layer; b) forming a dielectric layer on the polysilicon layer; c) forming a rugged oxide layer on the dielectric layer; d) removing a portion of the dielectric layer which is not covered by the rugged oxide layer for exposing a corresponding portion of the polysilicon layer; e) forming a plurality of microtrenches by etching the corresponding portion of the polysilicon layer; and f) removing the rugged oxide layer and the dielectric layer to obtain the trenched polysilicon structure.

18 Claims, 1 Drawing Sheet

METHOD FOR FORMING TRENCHED POLYSILICON STRUCTURE

FIELD OF THE INVENTION

The present invention relates to a method for forming a trenched polysilicon structure, and especially relates to a method for forming a trenched polysilicon structure applied to a semiconductor device.

BACKGROUND OF THE INVENTION

In the process for manufacturing the semiconductor, a trenched polysilicon structure is often used to increase the effective area of the capacitor, especially when the semiconductor is a miniaturized dynamic random access memory (DRAM). Because of the tendency of demanding the smaller size of semiconductor, different kinds of methods must be employed to increase its effective area so that the characteristic of the semiconductor will not be worsen as a result of the restriction on its size. In the conventional method, the trenched polysilicon structure is formed through the amorphous silicon deposition followed by an annealing process. Due to the relatively narrow temperature range (570~580° C.) for the deposition in this method, it is very hard to control the environment factors to maintain a proper temperature for the reaction system of the method.

SUMMARY OF THE INVENTION

An object of the present invention is to provide a preferable method for forming a trenched polysilicon structure to efficiently increase the effective area of the capacitor.

Another object of the present invention is to provide a method for forming a trenched polysilicon structure of a semiconductor device.

According to the present invention, the method includes steps of: a) providing a polysilicon layer; b) forming a dielectric layer on the polysilicon layer; c) forming a rugged oxide layer on the dielectric layer; d) removing a portion of the dielectric layer which is not covered by the rugged oxide layer for exposing a corresponding portion of the polysilicon layer; e) forming a plurality of microtrenches by etching the corresponding portion of the polysilicon layer; and f) removing the rugged oxide layer and the dielectric layer to obtain the trenched polysilicon structure.

In accordance with one aspect of the present invention, in the step (b), the thickness of the dielectric layer is greater than 30 Å.

In accordance with another aspect of the present invention, the dielectric layer is a silicon dioxide layer.

In accordance with another aspect of the present invention, the silicon dioxide layer is formed by thermal oxidation.

In accordance with another aspect of the present invention, the silicon dioxide layer is formed by chemical vapor deposition (CVD).

In accordance with another aspect of the present invention, tetra-ethyl-ortho-silicate (TEOS) is used as a gas source for the chemical vapor deposition.

In accordance with another aspect of the present invention, the dielectric layer is made of one selected from a group consisting of an undoped silicate glass, a doped silicate glass, a nitride, and an oxynitride.

In accordance with another aspect of the present invention, the dielectric layer made of doped silicate glass or nitride is formed by chemical vapor deposition (CVD).

In accordance with another aspect of the present invention, in the step (c), the rugged oxide layer is formed by using tetra-ethyl-ortho-silicate (TEOS) as a gas source and introducing ozone into the reaction system.

In accordance with another aspect of the present invention, the rugged oxide layer is formed at 300~600° C.

In accordance with another aspect of the present invention, the rugged oxide layer is formed at a pressure of 300~760 Torr.

In accordance with another aspect of the present invention, the rugged oxide layer is formed by introducing greater than 4% of ozone in the reaction system.

In accordance with another aspect of the present invention, in the step (d), the portion of the dielectric layer is removed by an etch back process.

In accordance with another aspect of the present invention, the etch back process is an anisotropic etch process.

In accordance with another aspect of the present invention, in the step (e), the plurality of microtrenches are formed by reactive ion etch (RIE)

In accordance with another aspect of the present invention, a depth of each microtrench is ranged from 500 Å to 1 μm.

In accordance with another aspect of the present invention, the selectivity ratio of the reactive ion etch (RIE) is greater than 20.

In accordance with another aspect of the present invention, in the step (f), the rugged oxide layer and the dielectric layer are removed by wet etching.

In accordance with another aspect of the present invention, in the step (f), the rugged oxide layer and the dielectric layer are removed by dry etching.

Another object of the present invention is to provide a trenched polysilicon structure applied in a semiconductor device.

The present invention may best be understood through the following description with reference to the accompanying drawings, in which:

DETAILED DESCRIPTION OF THE PREFERRED EMBODIMENT

Figure 1A:
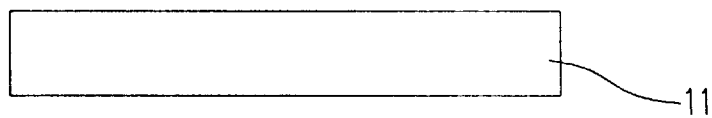
FIGS. 1 (a)~(f) are schematic diagrams showing a process for forming a trenched polysilicon structure of a preferred embodiment according to the present invention.
Figure 1B:
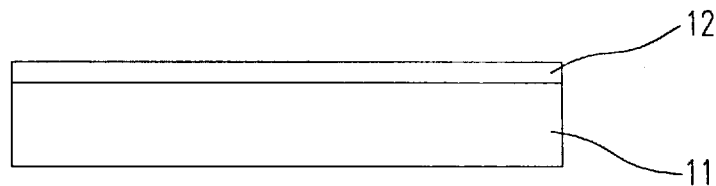
Figure 1C:
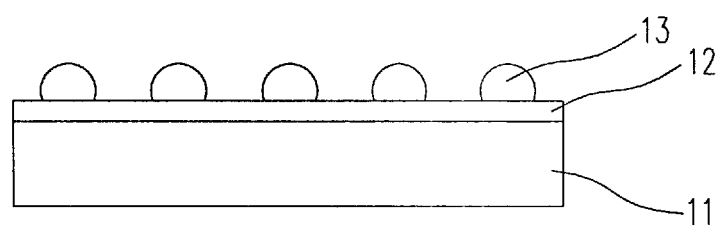
Figure 1D:
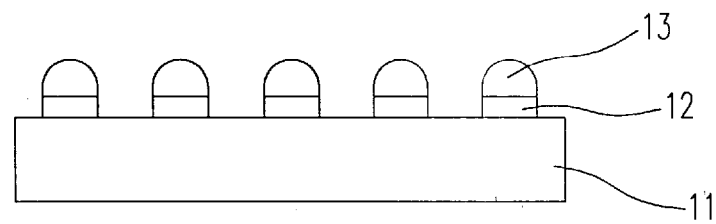
Figure 1E:
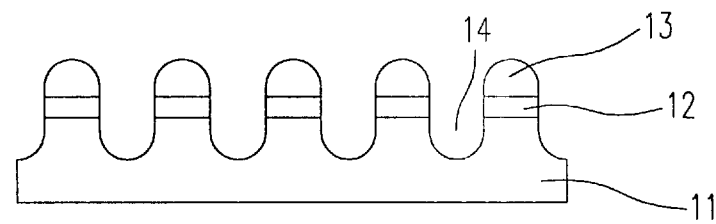
Figure 1F:
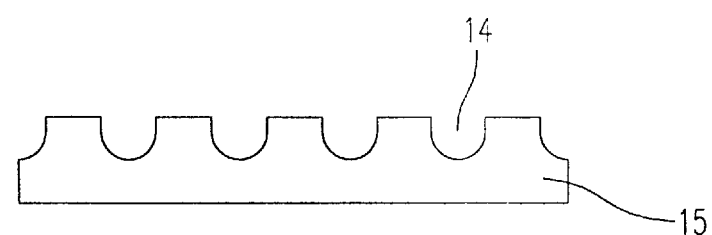

Please refer to FIG. 1 showing a process for forming a trenched polysilicon structure of a preferred embodiment of the present invention. In FIG. 1 (b), a dielectric layer 12 is formed over the polysilicon layer 11 by thermal oxidation or chemical vapor deposition (CVD) using tetra-ethyl-ortho-silicate (TEOS) as a gas source. The thickness of the dielectric layer 12 is greater than 30 Å. Certainly, the dielectric layer 12 can be made of undoped silicate glass (e.g. Fluorosilicate glass (FSG) or phosphosilicate glass (PSG), . . . etc.), doped silicate glass, nitride, or oxynitride.

Referring to FIG. 1 (c), the rugged oxide layer 13 is formed on the dielectric layer 12 by using tetra-ethyl-ortho-silicate (TEOS) as a gas source under the conditions of 300~600° C. and 300~600 Torr and introducing ozone (>4%) into the reaction system. Thereafter, a portion of the dielectric layer 12, not covered by the rugged oxide layer 13, is removed by an etch back process (an anisotropic etch process), using tetrafluoromethane ($CF_4$), trifluoromethane ($CHF_3$), or oxygen as an etch gas for exposing a corresponding portion of the polysilicon layer 11 as shown in FIG. 1 (d). Thenceforth, a plurality of microtrenches 14 are formed by etching the corresponding portion of the polysilicon layer 11 through a reactive ion etch (RIE) process having a selectivity ratio greater than 20 as shown in FIG. 1 (e). Chlorine ($Cl_2$), hydrogen bromide (HBr), or oxygen ($O_2$) is used for the reactive ion etch as an etch gas. Finally, the rugged oxide layer and the dielectric layer are removed by wet etching (using a buffer over etching (B.O.E.) solution or hydrofluoric acid (HF)) or dry etching to obtain the trenched polysilicon structure as shown in FIG. 1 (f).

To sum up, in the conventional method, the reaction system with relatively narrow temperature range (570~580° C.) is often influenced by the environment factors. For this reason, the present invention provides a preferable and novel method for forming a trenched polysilicon structure to avoid the defect inherent in the conventional method and to efficiently increase the effective area of the capacitor. While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a trenched polysilicon structure of a semiconductor device comprising steps of:
   a) providing a polysilicon layer;
   b) forming a dielectric layer on said polysilicon layer;
   c) depositing a rugged oxide layer on said dielectric layer by chemical vapor deposition (CVD) using tetra-ethyl-ortho-silicate (TEOS) as a gas source and introducing ozone into a reaction system; then
   d) removing a portion of said dielectric layer which is not covered by said rugged oxide layer for exposing a corresponding portion of said polysilicon layer;
   e) forming a plurality of microtrenches by etching said corresponding portion of said polysilicon layer; and
   f) removing said rugged oxide layer and said dielectric layer to obtain said trenched polysilicon structure.

2. A method according to claim 1 wherein in said step (b), a thickness of said dielectric layer is greater than 30 Å.

3. A method according to claim 2 wherein said dielectric layer is a silicon dioxide layer.

4. A method according to claim 3 wherein said silicon dioxide layer is formed by thermal oxidation.

5. A method according to claim 3 wherein said silicon dioxide layer is formed by chemical vapor deposition (CVD).

6. A method according to claim 5 wherein tetra-ethyl-ortho-silicate (TEOS) is used as a gas source for said chemical vapor deposition.

7. A method according to claim 1 wherein said dielectric layer is made of a dielectric selected from a group consisting of an updoped silicate glass, a doped silicate glass, a nitride, and an oxynitride.

8. A method according to claim 7 wherein said dielectric layer is formed by chemical vapor deposition (CVD) when made of doped silicate glass or nitride.

9. A method according to claim 1 wherein said rugged oxide layer is formed at 300~600° C.

10. A method according to claim 9 wherein said rugged oxide layer is formed at a pressure of 300~760 Torr.

11. A method according to claim 10 wherein said rugged oxide layer is formed by introducing greater than 4% of ozone in the reaction system.

12. A method according to claim 1 wherein in said step (d), said portion of said dielectric layer is removed by an etch back process.

13. A method according to claim 12 wherein said etch back process is an anisotropic etch process.

14. A method according to claim 1 wherein in said step (e), said plurality of microtrenches are formed by reactive ion etch (RIE).

15. A method according to claim 14 wherein a depth of each microtrench is ranged from 500 Å to 1 μm.

16. A method according to claim 14 wherein a selectivity ratio of said reactive ion etch (RIE) is greater than 20.

17. A method according to claim 1 wherein in said step (f), said rugged oxide layer and said dielectric layer are removed by wet etching.

18. A method according to claim 1 wherein in said step (f), said rugged oxide layer and said dielectric layer are removed by dry etching.

* * * * *